(12) United States Patent  (10) Patent No.: US 9,322,873 B2
Shu et al.  (45) Date of Patent: Apr. 26, 2016

(54) TESTING CIRCUIT AND PRINTED CIRCUIT BOARD USING SAME

(71) Applicants: Fu Tai Hua Industry (Shenzhen) Co., Ltd., Shenzhen (CN); HON HAI PRECISION INDUSTRY CO., LTD., New Taipei (TW)

(72) Inventors: Li-Sheng Shu, Shenzhen (CN); Tsung-Jen Chuang, New Taipei (TW); Shih-Fang Wong, New Taipei (TW)

(73) Assignees: Fu Tai Hua Industry (Shenzhen) Co., Ltd., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 383 days.

(21) Appl. No.: 13/873,248

(22) Filed: Apr. 30, 2013

(65) Prior Publication Data

US 2013/0328588 A1  Dec. 12, 2013

(30) Foreign Application Priority Data

Jun. 8, 2012  (CN) .......................... 2012 1 0187157 0

(51) Int. Cl.
  *G01R 31/02*  (2006.01)
  *G01R 31/28*  (2006.01)

(52) U.S. Cl.
  CPC ........ *G01R 31/2853* (2013.01); *G01R 31/2805* (2013.01); *G01R 31/2812* (2013.01)

(58) Field of Classification Search
  CPC ...... G01R 31/20; G01R 31/043; G01R 31/28; G01R 31/2801; G01R 31/2803; G01R 31/2805; G01R 31/22806; G01R 31/2808; G01R 31/2818; G01R 31/281; G01R 31/2812; G01R 31/2889; G01R 31/23181; G01R 31/318505; G01R 31/318508; G01R 31/07328; G01R 1/02; G01R 1/04; G01R 1/06; G01R 1/067; G01R 1/0433
  USPC ............. 324/763.01, 757.02, 754.07, 754.08, 324/227, 750.15, 750.16, 762.01, 762.02, 324/555, 756.01, 756.07
  See application file for complete search history.

(56) References Cited

U.S. PATENT DOCUMENTS 6,075,377 A * 6/2000 Tajima ..................... 324/762.01
6,291,978 B1 * 9/2001 Chandler ............ G01R 31/2812
                                                                324/73.1

(Continued)

FOREIGN PATENT DOCUMENTS

TW  201217982  5/2012

*Primary Examiner* — Jermele M Hollington
*Assistant Examiner* — Thang Le
(74) *Attorney, Agent, or Firm* — Novak Druce Connolly Bove + Quigg LLP

(57) ABSTRACT

A testing circuit for testing proper connections between pins and corresponding circuits within an integrated circuit includes a pin selection module. The pin selection module includes a plurality of input pins, an output pin, and a control pin. The pin selection module selectively connects one of the input pins to the output pin based upon a control signal from the control pin. A voltage-dividing module includes an input end to receive a test voltage, an output end connected with the output pin of the pin selection module, and a voltage-dividing element connected between the input end and the output end. A determination module receives an output voltage from the output end, and determines whether the voltage of the output end falls into one of several predetermined voltage ranges, and outputs a result accordingly.

16 Claims, 1 Drawing Sheet

(56) References Cited

U.S. PATENT DOCUMENTS

| | | | |
|---|---|---|---|
| 6,545,497 B2 * | 4/2003 | Hebert et al. | 324/756.02 |
| 6,867,572 B1 * | 3/2005 | Lin | G05F 1/575 323/273 |
| 7,057,310 B2 * | 6/2006 | Liu | G05F 1/575 307/126 |
| 8,179,154 B2 * | 5/2012 | Kuramochi | G01R 31/31926 324/762.01 |
| 2002/0125906 A1 | 9/2002 | Shaffroth | |
| 2005/0093561 A1 * | 5/2005 | Watanabe et al. | 324/763 |
| 2009/0134905 A1 * | 5/2009 | Long | 324/765 |
| 2012/0176039 A1 * | 7/2012 | Sato | H05B 33/0893 315/129 |
| 2013/0314119 A1 * | 11/2013 | Chen et al. | 324/762.01 |

\* cited by examiner

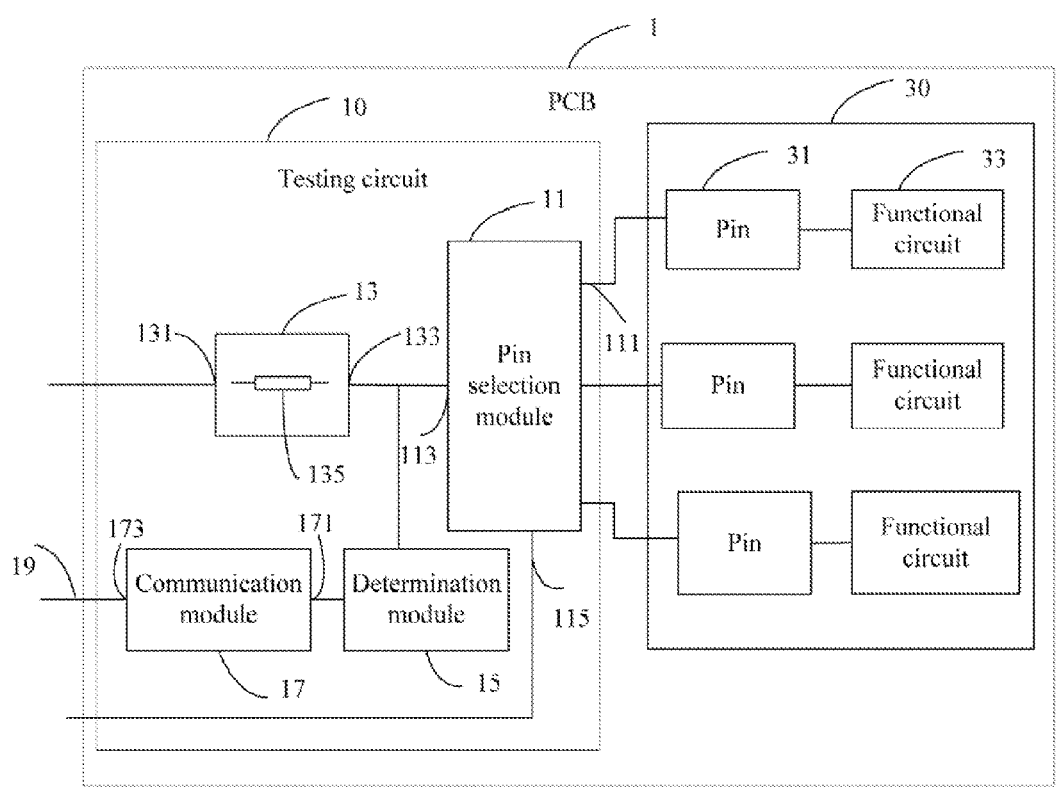

TESTING CIRCUIT AND PRINTED CIRCUIT BOARD USING SAME

BACKGROUND

1. Technical Field

The present disclosure relates to a testing circuit and printed circuit board using the same.

2. Description of Related Art

To test whether each pin of an integrated circuit is properly connected to a functional circuit(s) in the integrated circuit, a voltage of each pin can be measured using a probe of a measurement apparatus. The connection may be deemed proper if the voltage reading is correct. However, reading of voltage for each pin is not efficient.

Therefore, it is desirable to provide a testing circuit and printed circuit board which can overcome the above-mentioned problem.

BRIEF DESCRIPTION OF THE DRAWINGS

The drawing is a functional block diagram of a printed circuit board with voltage testing function, according to an embodiment.

DETAILED DESCRIPTION

Embodiments of the disclosure will be described with reference to the accompanying drawing.

Referring to the drawing, a printed circuit board 1, according to an embodiment, includes a testing circuit 10 and an integrated circuit 30. The integrated circuit 30 includes a number of pins 31 and a number of functional circuits 33. Each of the pins 31 is connected to a functional circuit 33. The testing circuit 10 tests whether each pin 31 is properly connected to the corresponding functional circuit 33.

The testing circuit 10 includes a pin selection module 11, a voltage-dividing module 13, a determination module 15, a communication module 17, and an output terminal 19.

The pin selection module 11 includes a number of input pins 111, an output pin 113, and a control pin 115. The pin selection module 11 selectively connects one of the input pins 111 to the output pin 113 based upon a control signal from the control pin 115. In an embodiment, the input pins 111 are respectively connected to the pins 31. The control signal is sent from a programmable device, such as a computer, and controls the pin selection module 11 to connect the input pins 111 to the output pin 113 in sequence. Thus, the pins 31 can be tested in sequence.

The voltage-dividing module 13 includes an input end 131, an output end 133, and a voltage-dividing element 135 connected between the input end 131 and the output end 133. The input end 131 is connected to receive a test voltage (e.g., a reference voltage). The test voltage can be supplied by an external device (not shown) or by the printed circuit board 1 itself. The voltage-dividing element 135 can be a resistor. Commonly, the functional circuits 33 are grounded. As such, voltage-dividing element 135 and the functional circuit 33 associated with the input pin 111 connected to the output pin 113 are connected in series, thereby the test voltage is applied on the functional circuit 33.

The determination module 15 is connected between the output end 133 and the communication module 17 and receives an output voltage from the output end 133. In an embodiment, a first voltage range, a second voltage range, and a third voltage range are pre-stored. The determination module 15 determines which range the output voltage falls into. When the output voltage falls into the first range, a first result indicating that the associated pin 111 is properly connected to the corresponding functional circuit 33 is generated and output. When the output voltage falls into the second range, a second result indicating that the associated pin 111 and the corresponding functional circuit 33 form an open circuit is generated and output. When the output voltage falls into the third range, a third result indicating that the associated pin 111 and the corresponding functional circuit 33 form a short circuit is generated and output. The first result, the second result, and the third result can be digital signals.

In alternative embodiments, only a first voltage range and a second voltage range are pre-stored. The determination module 15 determines which range the output voltage falls into. When the output voltage falls into the first range, a result indicating that the associated pin 31 is properly connected to the corresponding functional circuit 33 is generated and output. When the output voltage falls into the second range, a result indicating that the associated pin 31 is not properly connected to the corresponding functional circuit 33 is generated and output, where for example, an open circuit or a short circuit exists in the functional circuit 33. The two kinds of results may be digital signals.

The communication module 17 includes an input node 171 and an output node 173. The input node 171 is connected to the determination module 15 and receives and outputs the first result, or the second result, or the third result to the output terminal 19 via the output node 173, that is, the output node 173 is connected to the output terminal 19. In practice, the communication module 17 converts a first result, a second result, and a third result into a form compliant with universal asynchronous receiver/transmitter (UART) or inter-integrated circuit (I2c).

In an alternative embodiment, the communication module 17 can be omitted.

In another embodiment, the testing circuit 10 can be integrated into the integrated circuit 30.

Particular embodiments are shown here and described by way of illustration only. The principles and the features of the present disclosure may be employed in various and numerous embodiments thereof without departing from the scope of the disclosure as claimed. The above-described embodiments illustrate the scope of the disclosure but do not restrict the scope of the disclosure.

What is claimed is:

1. A testing circuit for testing an integrated circuit, the integrated circuit comprising a plurality of functional circuits and a plurality of pins, each of the pins connected to a corresponding one of the functional circuits, the testing circuit comprising:

a pin selection module, comprising a plurality of input pins, an output pin, and a control pin, wherein the pin selection module selectively connects one of the input pins to the output pin based upon a control signal from the control pin;

a voltage-dividing module, comprising an input end to receive a test voltage, an output end connected with the output pin of the pin selection module, and a voltage-dividing element connected between the input end and the output end; and a determination module, connected with the output end, to receive an output voltage from the output end, determining whether the voltage of the output end falls into one of predetermined voltage ranges, and outputting a result to indicate whether an associated pin of the integrated circuit is properly connected to the corresponding functional circuit when the voltage of the output end falls into one of the predetermined voltage ranges.

2. The testing circuit according to claim 1, further comprising a communication module comprising an input node and an output node, wherein the input node is connected to the determination module and configured to receive and output the result via the output node.

3. The testing circuit according to claim 2, wherein the communication module converts the result into a form compliant with universal asynchronous receiver/transmitter (UART) or inter-integrated circuit (I2c).

4. The testing circuit according to claim 1, wherein the predetermined voltage ranges comprise a first range, a second range, and a third range, the determination module determines which of the first range, the second range, and the third range the output voltage falls into, when the output voltage falls into the first range, a first result indicating that the associated pin is properly connected to the corresponding functional circuit is generated and output, when the output voltage falls into the second range, a second result indicating that the associated pin and the corresponding functional circuit form an open circuit is generated and output, when the output voltage falls into the third range, a third result indicating that the associated pin and the corresponding functional circuit form a short circuit is generated and output.

5. The testing circuit according to claim 4, wherein the first result, the second result, and the third result are digital signals.

6. The testing circuit according to claim 1, wherein the predetermined voltage ranges comprise a first range and a second range, the determination module determines which of the first range and the second range the output voltage falls into, when the output voltage falls into the first range, a result indicating that the associated pin is properly connected to the corresponding functional circuit is generated and output, when the output voltage falls into the second range, another result indicating that the associated pin is not properly connected to the corresponding functional circuit is generated and output.

7. The testing circuit according to claim 6, wherein the result and the another result are digital signals.

8. The testing circuit according to claim 1, wherein the control signal is sent from a programmable device to control the pin selection module to connect the input pins to the output pin in sequence, thereby the pins are tested in sequence.

9. A printed circuit board comprising:
an integrated circuit comprising a plurality of functional circuits and a plurality of pins, each of the pins connected to a corresponding one of the functional circuits; and
a testing circuit for testing the integrated circuit, comprising:
a pin selection module, comprising a plurality of input pins, an output pin, and a control pin, wherein the pin selection module selectively connects one of the input pins to the output pin based upon a control signal from the control pin;
a voltage-dividing module, comprising an input end to receive a test voltage, an output end connected with the output pin of the pin selection module, and a voltage-dividing element connected between the input end and the output end,
a determination module, connected with the output end, to receive an output voltage from the output end, determining whether the voltage of the output end falls into one of predetermined voltage ranges, and outputting a result to indicate whether an associated pin of the integrated circuit is properly connected to the corresponding functional circuit when the voltage of the output end falls into one of the predetermined voltage ranges.

10. The printed circuit board according to claim 9, wherein the testing circuit further comprises a communication module comprising an input node and an output node, the input node is connected to the determination module and configured to receive and output the result via the output node.

11. The printed circuit board according to claim 10, wherein the communication module converts the result into a form compliant with universal asynchronous receiver/transmitter (UART) or inter-integrated circuit (I2c).

12. The printed circuit board according to claim 9, wherein the predetermined voltage ranges comprise a first range, a second range, and a third range, the determination module determines which of the first range, the second range, and the third range the output voltage falls into, when the output voltage falls into the first range, a first result indicating that the associated pin is properly connected to the corresponding functional circuit is generated and output, when the output voltage falls into the second range, a second result indicating that the associated pin and the corresponding functional circuit form an open circuit is generated and output, when the output voltage falls into the third range, a third result indicating that the associated pin and the corresponding functional circuit form a short circuit is generated and output.

13. The printed circuit board according to claim 12, wherein the first result, the second result, and the third result are digital signals.

14. The printed circuit board according to claim 9, wherein the predetermined voltage ranges comprise a first range and a second range, the determination module determines which of the first range and the second range the output voltage falls into, when the output voltage falls into the first range, a result indicating that the associated pin is properly connected to the corresponding functional circuit is generated and output, when the output voltage falls into the second range, another result indicating that the associated pin is not properly connected to the corresponding functional circuit is generated and output.

15. The printed circuit board according to claim 14, wherein the result and the another result are digital signals.

16. The printed circuit board according to claim 9, wherein the control signal is sent from a programmable device to control the pin selection module to connect the input pins to the output pin in sequence, thereby the pins are tested in sequence.

* * * * *